United States Patent [19]
Hundt

[11] Patent Number: 5,461,257
[45] Date of Patent: Oct. 24, 1995

[54] INTEGRATED CIRCUIT PACKAGE WITH FLAT-TOPPED HEAT SINK

[75] Inventor: Michael J. Hundt, Double Oak, Tex.

[73] Assignee: SGS-Thomson Microelectronics, Inc., Carrollton, Tex.

[21] Appl. No.: 220,783

[22] Filed: Mar. 31, 1994

[51] Int. Cl.⁶ .................................................. H01L 23/02
[52] U.S. Cl. ............................................ 257/707; 257/706
[58] Field of Search ................................ 257/705, 706, 257/707, 717, 718, 719, 720, 722

[56] References Cited

U.S. PATENT DOCUMENTS

| | | | |
|---|---|---|---|
| 4,607,277 | 8/1986 | Hassan et al. | 257/719 |
| 4,765,400 | 8/1988 | Chu et al. | 257/722 |
| 4,770,242 | 9/1988 | Daikoku et al. | 257/722 |
| 4,908,695 | 3/1990 | Morihara et al. | 257/719 |
| 5,052,481 | 10/1991 | Horvath et al. | 257/718 |
| 5,113,315 | 5/1992 | Capp et al. | 257/706 |
| 5,345,107 | 9/1994 | Diakoku et al. | 257/720 |

*Primary Examiner*—Sara W. Crane
*Assistant Examiner*—S. V. Clark
*Attorney, Agent, or Firm*—Rodney M. Anderson; Lisa K. Jorgenson; Richard K. Robinson

[57] ABSTRACT

An integrated circuit package is disclosed, of the type having a pin-fin heat sink attached to the surface. A flat plate is attached to the ends of the pins of the heat sink, to provide a planar surface area of adequate size to allow a vacuum pickup tool to pick and place the packaged integrated circuit, and to receive marking and symbolization.

7 Claims, 1 Drawing Sheet

5,461,257

INTEGRATED CIRCUIT PACKAGE WITH FLAT-TOPPED HEAT SINK

This invention is in the field of integrated circuits, and more specifically is in the field of integrated circuit packaging.

BACKGROUND OF THE INVENTION

Many modern integrated circuits, especially those of the microprocessor type, now integrate upwards of hundreds of thousands of transistors into a single semiconductor chip to provide a high degree of functionality at very high speeds. Even when utilizing low-power technologies such as complementary metal-oxide-semiconductor (CMOS) technology, these ultra-large-scale integrated (ULSI) circuits dissipate significant electrical power, for example more than one watt.

As is well known in the art, the electrical power dissipated in an integrated circuit is often manifest as thermal energy in the semiconductor chip. This thermal energy will tend to elevate the temperature of the semiconductor chip. As is well known in the art, both the switching speed and the reliability of an integrated circuit decrease with increasing temperature. As a result, integrated circuit package design is highly concerned with the conduction of thermal energy away from the semiconductor chip, such conduction taking place through the package, in an attempt to minimize performance and reliability degradation due to high operating chip temperatures.

Referring now to FIG. 1, a conventional integrated circuit package for providing high thermal conductivity is illustrated. In this example, the semiconductor chip is housed within pin-grid-array package 2. As is conventional in the art, pin-grid-array package 2 is a ceramic header, within which the semiconductor chip is mounted and its conductive terminal pads bonded, by wire bonds or the like, to pins extending from the bottom of pin-grid-array package 2; a ceramic or metal lid is then bonded to the header by way of glass reflow, brazing, or by way of other conventional techniques. In the example shown in FIG. 1, heat sink 4, of the "pin-fin" type, is mounted to the top surface of pin-grid-array package 2. Heat sink 4 is conventionally formed of extruded aluminum or another thermally conductive material, and includes a flat lower portion 4f that is attached to pin-grid-array package 2 by way of a thermally conductive epoxy, or by other conventional means.

The upper portion of heat sink 4, as shown in FIG. 1, includes a large number of finger-like extensions, or pins, 4e extending away from pin-grid-array package 2. Extensions 4e are responsible for nearly all of the surface area of heat sink 4. As such, extensions 4e will provide a highly thermally conductive path from pin-grid-array package 2 to the atmosphere thereabove, without greatly increasing the overall height of the package combination. Especially if a flow of cool air passes over and through extensions 4e, conventional heat sink 4 can be quite useful in removing thermal energy from the semiconductor chip packaged in pin-grid-array package 2.

However, considering that heat sink 4 is generally attached to pin-grid-array package 2 by the manufacturer of the integrated circuit, the arrangement of FIG. 1 suffers from certain limitations. Firstly, many computer and system manufacturers use vacuum pickup tools to transport and install packaged integrated circuits into circuit boards; this is especially the case for system manufacturers that use automated pick-and-place robotic machines in circuit board assembly. However, vacuum pickups cannot readily be used with the arrangement of FIG. 1, as there is not adequate planar surface area on its top to allow a vacuum pickup to reliably attach to heat sink 4 (and thus to lift and transport pin-grid-array package 2). This may require manual installation of the package of FIG. 1, at greater cost and often reduced accuracy.

Secondly, there is also not enough coplanar surface area on the upper surface of the integrated circuit package of FIG. 1 to allow the manufacturer or purchaser of the integrated circuit to mark the packaged circuit with a code, part number, or manufacturer identification. Particularly if multiple integrated circuits similarly packaged are to be mounted to the same circuit board, the arrangement of FIG. 1 can result in manufacturing defects in the end system with the wrong integrated circuit mounted at the wrong circuit board location.

It is therefore an object of the present invention to provide an integrated circuit package utilizing pin-fin thermal conduction and that may be mounted by vacuum pickup equipment.

It is a further object of the present invention to provide such an integrated circuit package that allows for topside symbolization and marking after manufacture.

Other objects and advantages of the present invention will become apparent to those of ordinary skill in the art having reference to the following specification together with its drawings.

SUMMARY OF THE INVENTION

The invention may be implemented into an integrated circuit package which has a pin-fin heat sink attached to its exposed surface. A flat plate, preferably of a thermally conductive material, is attached to the tops of the heat sink pins so that the pins are substantially orthogonal to the plate. The flat plate provides a coplanar surface by way of which a vacuum pickup may pick and place the integrated circuit package, and upon which conventional device marking may be placed. The exposed surface of the plate may be flush with, or extend above, the ends of the heat sink pins.

DETAILED DESCRIPTION OF THE PREFERRED EMBODIMENTS

Figure 1:
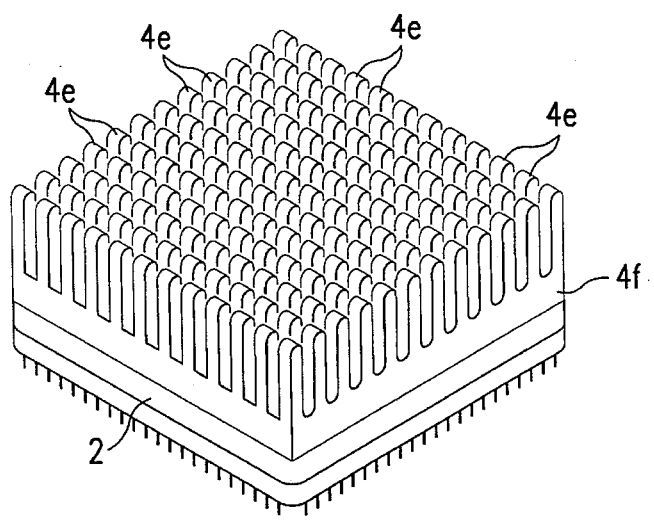
FIG. 1 is a perspective view of a conventional integrated circuit package, of the pin-grid-array type, with a heat sink of the pin-fin type attached thereto.
Figure 2:
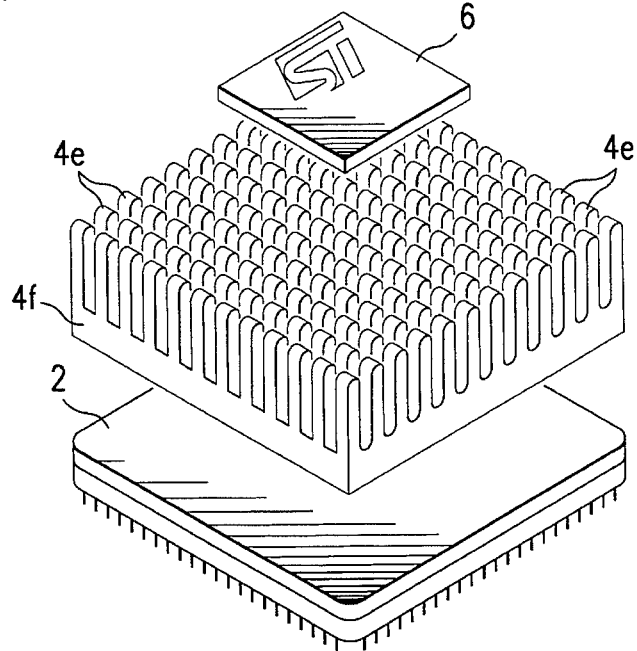
FIG. 2 is an exploded perspective view of an integrated circuit package according to a first preferred embodiment of the invention.
Figure 3A:
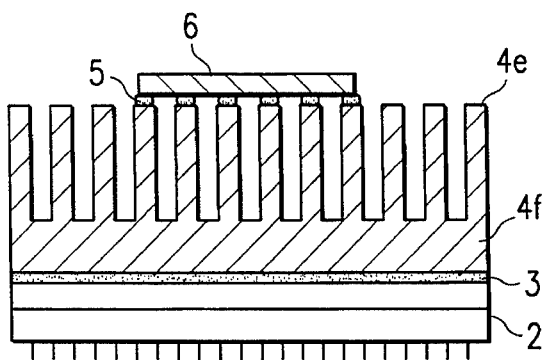
FIG. 3a is a cross-sectional elevation view of the integrated circuit package of FIG. 2, after assembly.

Referring now to FIG. 2, a first preferred embodiment of the invention will now be described in detail. As shown in the exploded perspective view of FIG. 2, this embodiment of the invention includes pin-grid-array package 2, similarly as in the conventional package arrangement discussed above relative to FIG. 1. Of course, package 2 may be implemented as a ball-grid-array package, a chip carrier, a dual-in-line package, or an integrated circuit package of other conventional type having a flat surface that will be exposed when package 2 is mounted to a circuit board. Also similarly as discussed above relative to the conventional arrangement of FIG. 1, pin-fin heat sink 4 is also provided, having a flat portion 4f for mounting to the surface of package 2 in a thermally conductive fashion, such as by way of a thermally conductive epoxy, solder, or the like. FIG. 3a illustrates the package arrangement of FIG. 2 after its assembly, including epoxy layer 3 disposed between the surface of package 2 and the bottom of flat portion 4f of heat sink 4. Also as discussed above, heat sink 4 also includes extensions 4e, which extend away from package 2 and which provide a large surface area for heat sink 4, thus improving the thermal conduction between it and the atmosphere surrounding the package.

According to the present invention, plate 6 is provided for mounting to the ends of extensions 4e of pin-fin heat sink 4. FIG. 3a illustrates, in cross-section, plate 6 after mounting to the ends of extensions 4e, such mounting preferably made by way of a conductive epoxy 5. Plate 6 is preferably formed of aluminum, or of another thermally conductive material, to provide additional thermal conduction to the atmosphere; alternatively, if the thermal conduction provided by heat sink 4 is otherwise adequate, plate 6 may be formed of plastic or another conventional material, with the adhesive between it and extensions 4e selected accordingly. It is preferred that plate 6 be somewhat smaller than the plan area of heat sink 4 and package 2, as the dimensions of plate 6 need only be as large as necessary to provide easy vacuum pickup by conventional vacuum pick-and-place equipment, and to accomplish the desired marking or symbolization (such marking illustrated in FIG. 2). This is preferred, as full coverage of the plan area of heat sink 4 with plate 6 may impede the flow of coolant air thereover. For example, plate 6 may be on the order of 20 mm square.

Further in the alternative, plate 6 may be formed integrally with heat sink 4, so that no additional attachment step is required. A separately attachable plate 6 is preferred, however, as this allows for heat sink 4 to be extruded, as an integrated heat sink and plate would likely require a more complicated manufacturing process.

As will be evident from FIG. 2, plate 6 provides adequate planar surface area to allow the combination of package 2, heat sink 4, and plate 6 to be lifted, transported, and placed by conventional vacuum pickup tools, whether operated by hand or by robot. Further, plate 6 provides an exposed planar surface area adequate to receive marking with the manufacturer's identifying name or mark, with a part number, with a performance grade indicator, or the like. FIG. 2 illustrates plate 6 as marked with a manufacturer's trademark, for example. As a result, the package according to the present invention overcomes the limitations of conventional pin-fin heat sink integrated circuit packages, such as that shown in FIG. 1, which are necessarily incompatible with vacuum pickup equipment and which are not readily marked with manufacturer identifiers, part numbers, and the like.

Figure 3B:
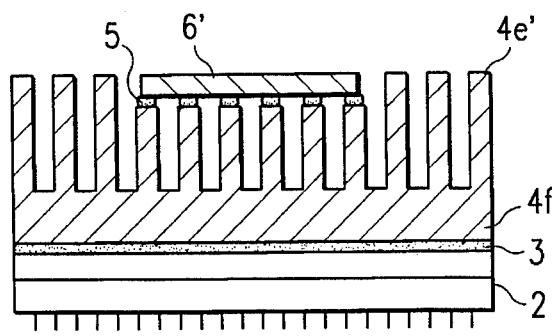
FIG. 3b is a cross-sectional elevation view of an integrated circuit package according to an alternative embodiment of the invention.

Referring now to FIG. 3b, an alternative embodiment of the invention will now be described. According to this alternative embodiment of the invention, extensions 4e' are shorter in the interior of heat sink 4' than at the perimeter, so that the exposed top surface of plate 6' will be flush with those of extensions 4e' to which plate 6' is not mounted. This alternative embodiment of FIG. 3b may be preferred over that of FIG. 3a, in those cases where the manufacturing processes involve lateral forces across the top of heat sink 4; in the embodiment of FIG. 3b, plate 6' will be less prone to inadvertent removal from heat sink 4' by such a lateral force.

While the invention has been described herein relative to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

I claim:

1. A packaged integrated circuit, comprising:
   an integrated circuit package, containing an integrated circuit chip, and having a flat surface;
   a heat sink attached to the flat surface of the integrated circuit package, said heat sink having a plurality of extensions extending away from the integrated circuit package; and
   a plate, attached to the ends of the extensions, and having a flat surface that is substantially parallel with the flat surface of the integrated circuit package, wherein the flat surface of the plate has an area that is substantially smaller than the area of the flat surface of the integrated circuit package.

2. The integrated circuit of claim 1, further comprising:
   means for attaching the plate to the ends of the extensions.

3. The integrated circuit of claim 2, wherein the attaching means comprises a thermally conductive epoxy.

4. The integrated circuit of claim 1, wherein the plate is formed integrally with the heat sink.

5. The integrated circuit of claim 1, wherein the integrated circuit package is of the pin-grid-array type.

6. The integrated circuit of claim 1, wherein the integrated circuit package is of the ball-grid-array type.

7. The integrated circuit of claim 1, further comprising:
   marking on the flat surface of said plate.

* * * * *